United States Patent
Reiss et al.

(10) Patent No.: US 9,281,210 B2
(45) Date of Patent: Mar. 8, 2016

(54) WET-PROCESS CERIA COMPOSITIONS FOR POLISHING SUBSTRATES, AND METHODS RELATED THERETO

(71) Applicant: Cabot Microelectronics Corporation, Aurora, IL (US)

(72) Inventors: Brian Reiss, Woodridge, IL (US); Jeffrey Dysard, St. Charles, IL (US); Sairam Shekhar, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/050,977

(22) Filed: Oct. 10, 2013

(65) Prior Publication Data

US 2015/0104939 A1    Apr. 16, 2015

(51) Int. Cl.
*H01L 21/306* (2006.01)
*H01L 21/3105* (2006.01)

(52) U.S. Cl.
CPC ............................ *H01L 21/31053* (2013.01)

(58) Field of Classification Search
None
See application file for complete search history.

(56) References Cited

U.S. PATENT DOCUMENTS

| | | | |
|---|---|---|---|
| 5,196,353 A | 3/1993 | Sandhu et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,238,450 B1 * | 5/2001 | Garg ................... | C01F 17/0043 257/E21.23 |
| 6,293,848 B1 * | 9/2001 | Fang et al. ....................... | 451/36 |
| 6,689,692 B1 * | 2/2004 | Grover et al. .................. | 438/691 |
| 6,740,589 B2 * | 5/2004 | Shimazu et al. .............. | 438/691 |
| 6,984,588 B2 * | 1/2006 | Grover et al. .................. | 438/691 |
| 7,071,105 B2 * | 7/2006 | Carter et al. .................. | 438/690 |
| 7,381,690 B1 * | 6/2008 | Ding ..................... | C10M 173/02 508/137 |
| 7,442,645 B2 * | 10/2008 | Carter et al. .................. | 438/690 |
| 8,853,082 B2 * | 10/2014 | Hanano et al. ................ | 438/692 |
| 2002/0016060 A1 * | 2/2002 | Matsuzawa et al. .......... | 438/633 |
| 2002/0197935 A1 * | 12/2002 | Mueller et al. .................... | 451/36 |
| 2003/0228762 A1 | 12/2003 | Moeggenborg et al. | |
| 2004/0010978 A1 * | 1/2004 | Uchino et al. .................. | 51/307 |
| 2004/0065022 A1 * | 4/2004 | Machii et al. .................. | 51/309 |
| 2004/0132306 A1 * | 7/2004 | Bellman .................. | C09G 1/02 438/690 |
| 2005/0189322 A1 * | 9/2005 | Lane et al. ..................... | 216/88 |
| 2006/0024967 A1 * | 2/2006 | De Rege Thesauro et al. ............................. | 438/692 |
| 2007/0210278 A1 * | 9/2007 | Lane et al. .................... | 252/79.1 |
| 2007/0218811 A1 * | 9/2007 | Kurata et al. ................... | 451/28 |
| 2007/0240366 A1 * | 10/2007 | Ota et al. ........................ | 51/298 |

(Continued)

FOREIGN PATENT DOCUMENTS

WO    WO 2007/135794 A1    11/2007

*Primary Examiner* — Allan Olsen
(74) *Attorney, Agent, or Firm* — Thomas Omholt; Arlene Hornilla; Salim Hasan

(57) ABSTRACT

Disclosed are a chemical-mechanical polishing composition and a method of polishing a substrate. The polishing composition comprises low average particle size (e.g., 30 nm or less) wet-process ceria abrasive particles, at least one alcohol amine, and water, wherein said polishing composition has a pH of about 6. The polishing composition can be used, e.g., to polish any suitable substrate, such as a polysilicon wafer used in the semiconductor industry.

18 Claims, 8 Drawing Sheets

(56) References Cited

U.S. PATENT DOCUMENTS

| | | |
|---|---|---|
| 2007/0270085 A1 | 11/2007 | Ota et al. |
| 2008/0070412 A1* | 3/2008 | Yoshida .............. B24B 37/0056 438/693 |
| 2008/0085663 A1* | 4/2008 | Yoshida ................ B24B 37/044 451/60 |
| 2008/0141594 A1* | 6/2008 | Kishimoto et al. ............. 51/309 |
| 2009/0140198 A1* | 6/2009 | Lee .......................... C09G 1/02 252/79.1 |
| 2010/0029181 A1* | 2/2010 | De Rege Thesauro et al. . 451/37 |
| 2010/0152077 A1* | 6/2010 | Allston et al. ................. 508/165 |
| 2010/0159698 A1* | 6/2010 | McConnell et al. .......... 438/693 |
| 2011/0124195 A1 | 5/2011 | Park et al. |
| 2012/0077419 A1* | 3/2012 | Zhang et al. ..................... 451/36 |
| 2012/0280170 A1* | 11/2012 | De Rege Thesauro et al. ........................... 252/79.1 |
| 2012/0315763 A1* | 12/2012 | Hanano et al. ................ 438/693 |
| 2013/0230444 A1* | 9/2013 | Reed .............................. 423/263 |
| 2013/0244433 A1* | 9/2013 | Reiss et al. .................... 438/693 |
| 2014/0051250 A1* | 2/2014 | Minami et al. ................ 438/693 |

* cited by examiner

WET-PROCESS CERIA COMPOSITIONS FOR POLISHING SUBSTRATES, AND METHODS RELATED THERETO

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. Polishing compositions are typically used in conjunction with polishing pads (e.g., a polishing cloth or disk). Instead of, or in addition to, being suspended in the polishing composition, the abrasive material may be incorporated into the polishing pad.

The shallow trench isolation (STI) process is a method for isolating elements of a semiconductor device. In a STI process, a polysilicon layer is formed on a silicon substrate, shallow trenches are formed via etching or photolithography, and a dielectric layer (e.g., an oxide) is deposited to fill the trenches. Due to variation in the depth of trenches, or lines, formed in this manner, it is typically necessary to deposit an excess of dielectric material on top of the substrate to ensure complete filling of all trenches.

The excess dielectric material is then typically removed by a chemical-mechanical planarization process to expose the polysilicon layer. When the polysilicon layer is exposed, the largest area of the substrate exposed to the chemical-mechanical polishing composition comprises polysilicon, which must then be polished to achieve a highly planar and uniform surface. Thus, the polysilicon layer has served as a stopping layer during the chemical-mechanical planarization process, as the overall polishing rate decreases upon exposure of the polysilicon layer.

The STI substrate is typically polished using a conventional polishing composition. However, polishing STI substrates with conventional polishing compositions has been observed to result in over polishing of the substrate surface or the formation of recesses in the STI features and other topographical defects such as microscratches on the substrate surface. Over polishing of the substrate may also result in oxide loss and exposure of the underlying oxide to damage from polishing or chemical activity, which detrimentally affects device quality and performance.

A need remains for polishing compositions and polishing methods that will exhibit desirable planarization efficiency, uniformity, and removal rate during the polishing and planarization of substrates such as semiconductors, especially polysilicon substrates, while minimizing defectivity, such as surface imperfections and damage to underlying structures and topography during polishing and planarization. The invention provides such a polishing composition and method. These and other advantages of the invention, as well as additional inventive features, will be apparent from the description of the invention provided herein.

BRIEF SUMMARY OF THE INVENTION

In one aspect, the invention provides a chemical-mechanical polishing composition comprising, consisting essentially of, or consisting of (a) wet-process ceria abrasive particles having an average particle size of about 30 nm or less, (b) at least one alcohol amine, and (c) water, wherein the polishing composition has a pH of about 6 or more.

In another aspect, the invention provides a method of polishing a substrate. The method comprises contacting a substrate with a polishing pad and a polishing composition comprising (a) wet-process ceria abrasive particles having an average particle size of about 30 nm or less, (b) at least one alcohol amine, and (c) water, wherein the polishing composition has a pH of about 6 or more. The method further comprises moving the polishing pad and the polishing composition relative to the substrate to abrade at least a portion of the substrate to polish the substrate.

BRIEF DESCRIPTION OF THE SEVERAL VIEWS OF THE DRAWING(S)

DETAILED DESCRIPTION OF THE INVENTION

Figure 1:
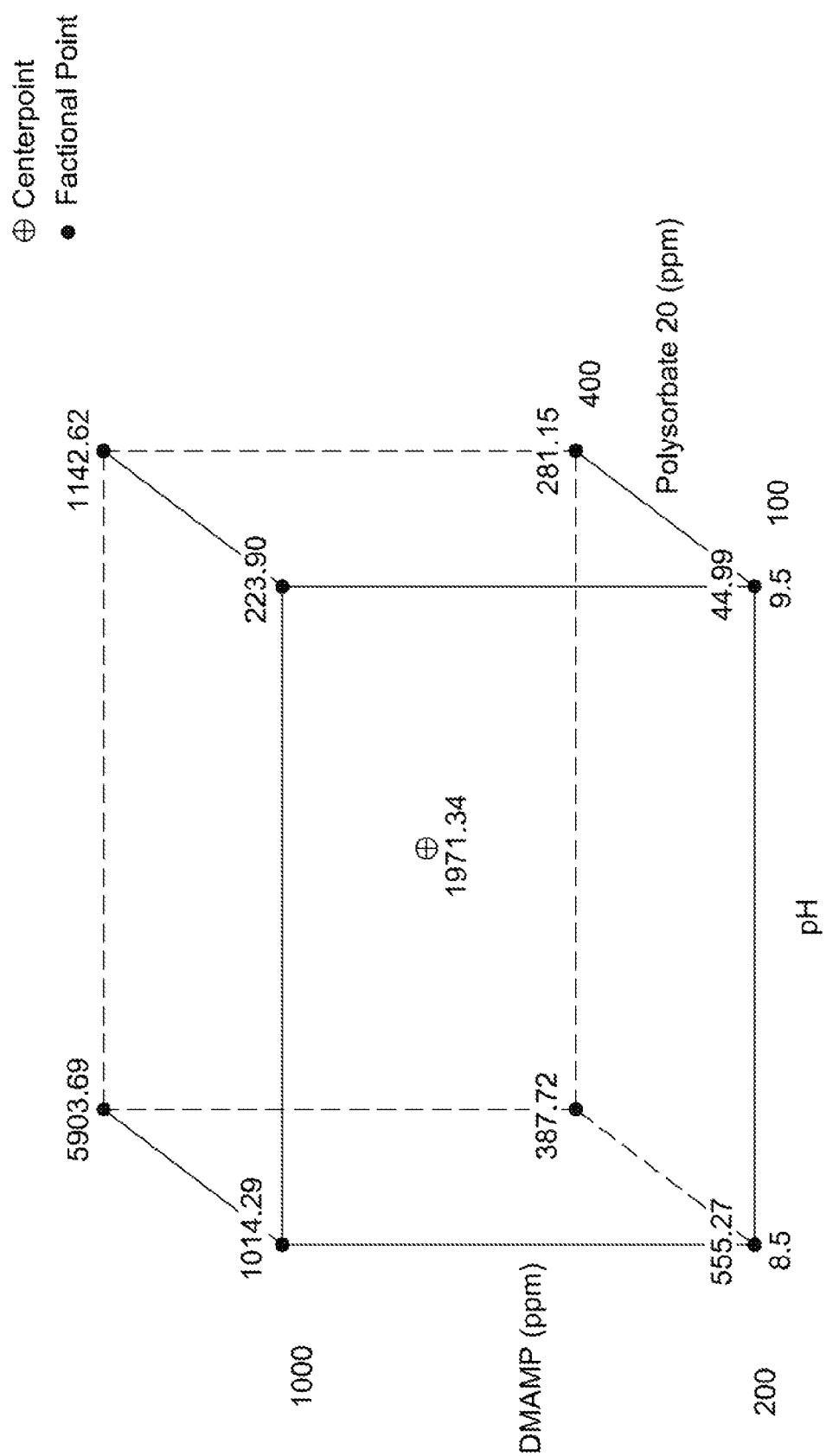
FIG. 1 is a cube plot of high density plasma (HDP) removal rates of the polishing compositions of Example 1 herein versus pH (X-axis), 2-dimethylamino-2-methylpropanol (DMAMP) concentration (Y-axis), and polysorbate 20 concentration (Z-axis).

Embodiments of the invention provide a chemical-mechanical polishing composition comprising, consisting essentially of, or consisting of (a) wet-process ceria abrasive particles of an average particle size of about 30 nm or less, (b) one or more alcohol amines, and (c) water, wherein the pH of the chemical-mechanical polishing composition is about 6 or more. Such a polishing composition is in the form of a slurry and can be used to polish any suitable substrate, such as mechanically weak surfaces (e.g., polysilicon) with a suitable chemical-mechanical polishing (CMP) apparatus including a polishing pad, such as described herein.

In some embodiments, the polishing composition achieves high removal rates of dielectric layers (e.g., oxides). Additionally, in some embodiments, the polishing composition achieves a low removal rate of polysilicon and/or silicon nitride. Additionally, in some embodiments, the polishing composition achieves high removal rates of dielectric layers while simultaneously achieving low removal rates of polysilicon and/or silicon nitride. Additionally, in some embodiments, the polishing composition exhibits uniformity in the loss of material present on a substrate. As utilized herein, the term "uniformity" refers to a measurement of the total loss of material on a substrate from specified areas of the substrate (e.g., the edge, middle, center of a substrate), and comparing the measurements from each area, wherein closer values correspond to greater uniformity. Additionally, in some embodiments, the polishing composition exhibits low dishing within dielectric layer trenches. As utilized herein, the term "dishing" refers to the degree a recess forms in trenches filled with a dielectric layer. Dishing is measured by taking the difference in height between a dielectric-filled trench and an adjacent feature (e.g., a polysilicon feature). Dishing can be measured by ellipsometry known to one skilled in the art. Furthermore, in some embodiments, the polishing composition achieves low defectivity on the substrate being polished. As utilized herein, the term "defectivity" refers to counting defects (e.g., scratches), present on a substrate after polishing a substrate with a polishing composition. Defectivity can be measured by scanning electron microscopy known to one skilled in the art.

The chemical-mechanical polishing composition comprises a ceria abrasive. As known to one of ordinary skill in the art, ceria is an oxide of the rare earth metal cerium, and is also known as ceric oxide, cerium oxide (e.g., cerium(IV) oxide), or cerium dioxide. Cerium(IV) oxide ($CeO_2$) can be formed by calcining cerium oxalate or cerium hydroxide. Cerium also forms cerium(III) oxides such as, for example $Ce_2O_3$. The ceria abrasive can be any one or more of these or other oxides of ceria.

The ceria abrasive can be of any suitable type. Preferably, the ceria abrasive is wet-process ceria. As used herein, "wet-process" ceria refers to a ceria prepared by a precipitation, condensation-polymerization, or similar process (as opposed to, for example, fumed or pyrogenic ceria). For example, in some embodiments, the wet-process ceria is formed by precipitating a cerium-containing precursor by adjusting pH and pressure to control the precipitation to achieve a controlled particle size. Thus, wet-process techniques can result in smaller particles by controlling the particle growth in this manner, in contrast to dry process techniques where a calcining process is typically used to try and anneal the cerium oxide from ceria-containing precursor to achieve the crystallinity that is desired.

A polishing composition of the invention comprising wet-process ceria abrasive has been typically found to exhibit lower defects when used to polish substrates according to a method of the invention. Without wishing to be bound to a particular theory, it is believed that wet-process ceria comprises substantially spherical ceria particles and/or smaller aggregate ceria particles, thereby resulting in lower substrate defectivity when used in the inventive method. It is further believed that the wet-process ceria particles as described herein will contact a substrate, such as a wafer, with less momentum and energy, thereby reducing size and frequency of defects such as scratches. An illustrative wet-process ceria is HC-60™ ceria commercially available from Rhodia, Cranbury, N.J.

For non-spherical particles, the size of the particle is the diameter of the smallest sphere that encompasses the particle. The unmodified phrase "particle size", as utilized herein, may refer to one or both of primary and secondary particles. Primary particles refer to those individual ceria particles dispersed in aqueous carrier (e.g., water), whereas secondary particles refer to aggregates of individual ceria particles fused together in water. The particle size can be measured using any suitable technique, for example, using laser diffraction techniques known to those skilled in the art.

The ceria abrasive particles can have any suitable average particle size (i.e. average particle diameter) of about 40 nm or less, e.g., about 35 nm or less, about 30 nm or less, about 29 nm or less, about 28 nm or less, about 27 am or less, about 26 m or less, about 25 nm or less, about 24 nm or less, about 23 nm or less, about 22 nm or less, about 21 nm or less, about 20 nm or less, about 18 nm or less, about 15 nm or less, about 12 nm or less, about 10 nm or less, about 7 nm or less, about 5 nm or less, about 3 nm or less, about 1 nm or less or about 0.1 nm or less. Each of the aforementioned endpoints can have a lower limit, e.g., ranging from about 0.1 nm to about 40 nm, as numerically appropriate, such as a lower limit of about 0.1 nm, about 1 nm, about 2 nm, about 3 nm, about 4 nm, about 5 nm, about 6 nm, about 7 nm, about 10 nm, about 12 nm, about 15 nm, about 18 nm, about 20 nm, about 22 nm, about 25 nm, 30 nm, 35 nm, or about 39 nm. For example, the ceria abrasive particles can have an average particle size from about 0.1 nm to about 40 nm, e.g., from about 14 nm to about 24 nm, from about 18 nm to about 23 nm, from about 17 am to about 21 nm, from about 3 nm to about 27 nm, from about 5 nm to about 26 nm, from about 7 nm to about 30 nm, or from about 15 nm to about 25 nm etc. Preferably, the ceria abrasive particles have an average particle size of about 30 nm or less.

In some embodiments, the polishing composition can comprise ceria abrasive particles having an average primary particle size of about 16 nm or less. The ceria abrasive particles can have any suitable average primary particle size of about 16 an or less, e.g., about 15 nm or less, about 14 nm or less, about 12 nm or less, about 1 nm or less, about 10 nm or less, about 9 nm or less, about 8 nm or less, about 7 nm or less, about 6 nm or less, about 5 nm or less, about 3 nm or less, or about 1 nm or less Each of the aforementioned endpoints can have a lower limit, e.g., ranging from about 0.1 nm to about 16 nm, as numerically appropriate, such as a lower limit of about 0.1 nm, about 1 nm, about 2 nm, about 3 nm, about 4 nm, about 5 nm, about 6 nm, about 7 nm, about 10 nm, about 12 nm, about 14 nm, or about 16 nm. For example, the ceria abrasive particles can have an average primary particle size from about 0.1 nm to about 16 nm, e.g., from about 1 nm to about 11 nm, from about 4 nm to about 7 nm, from about 2 nm to about 10 nm, from about 3 nm to about 8 nm, or from about 5 nm to about 9 nm. Preferably, the ceria abrasive particles have an average primary particle size of about 12 nm or less.

The ceria abrasive particles can have any suitable average secondary particle size (i.e. average particle diameter) of about 40 nm or less, e.g., about 35 nm or less, about 30 nm or less, about 29 nm or less, about 28 nm or less, about 27 nm or less, about 26 nm or less, or about 25 nm or less. Each of the aforementioned endpoints can have a lower limit, e.g., ranging from about 25 nm to about 40 nm, as numerically appropriate, such as a lower limit of about 25 nm, about 26 nm, about 27 nm, about 28 nm, about 29 nm, about 30 nm, about 35 nm, about 39 nm, or about 40 nm. For example, the ceria abrasive particles can have an average secondary particle size from about 25 nm to about 40 nm, e.g., from about 26 nm to about 35 nm, from about 27 nm to about 30 nm, or from about 28 nm to about 29 nm. Preferably, the ceria abrasive particles have an average secondary particle size of about 30 nm or less.

In accordance with some embodiments, the ceria abrasive particles are substantially free of agglomeration in the polishing composition. Agglomeration creates larger particle sizes in a polishing composition, thus producing higher impact collisions upon the substrate surface being polished with a polishing composition. Thus, agglomeration can result in higher defectivity on the substrate surface. As utilized herein the phrase "substantially free", means zero agglomeration or an immaterial amount of agglomeration. An immaterial amount of agglomeration can be, e.g., 1% or less by weight of all ceria particles in the polishing composition, such as, for example about 0.5% or less, about 0.1% or less, about 0.01% or less or about 0.001% or less.

The ceria particles preferably are colloidally stable in the inventive polishing composition. The term colloid refers to the suspension of abrasive particles in the liquid carrier. Colloidal stability refers to the maintenance of that suspension through time. In the context of the invention, the ceria abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ($[B]$ in terms of g/ml) and the concentration of the particles in the top 50 ml of the graduated cylinder ($[T]$ in terms of g/ml) divided by the initial concentration of particles in the abrasive composition ($[C]$ in terms of g/ml) is less than or equal to 0.5 (i.e., $\{[B]-\{T\}\}/[C] \leq 0.5$). More preferably, the value of $[B]-[T]/[C]$ is less than or equal to 0.3, and most preferably is less than or equal to 0.1.

The ceria abrasive particles can be present in the polishing composition at any suitable amount. If the polishing composition of the invention comprises too little ceria abrasive, the composition may not exhibit a sufficient removal rate. In contrast, if the polishing composition comprises too much ceria abrasive the polishing composition may exhibit undesirable polishing performance and/or may not be cost effective and/or may lack stability.

Advantageously, in some embodiments the ceria abrasive particles are present in lower solids concentrations as compared with conventional systems, which often exceed 10-12 wt % solids. The use of lower amounts of ceria abrasive particles, in accordance with embodiments of the invention, can result in lower defectivity and substantial cost savings.

For example, the ceria abrasive particles can be present at a concentration of about 0.0005 wt. % or more, e.g., about 0.001 wt. % or more, about 0.005 wt. % or more, about 0.01 wt. % or more, about 0.05 wt. % or more, about 0.1 wt. % or more, or about 0.5 wt. % or more. Alternatively, or in addition, the ceria abrasive particles can be present in the polishing composition at a concentration of about 10 wt. % or less, e.g., about 9 wt. % or less, about 8 wt. % or less, about 7 wt. % or less, about 5 wt. % or less, about 3 wt. % or less, about 2 wt. % or less, or about 1 wt. % or less. Thus, the polishing composition can include ceria abrasive particles at a concentration within a range bounded by any two of the aforementioned endpoints. For example, the ceria abrasive particles can be present at a concentration from about 0.0005 wt. % to about 10 wt. %, e.g., from about 0.1 wt. % to about 1.0 wt. %, from about 0.01 wt. % to about 3.0 wt. %, from about 0.005 wt. % to about 7.0 wt. %, from about 0.05 wt. % to about 9.0 wt. %, from about 0.5 wt. % to about 8.0 wt. %, or from about 0.001 wt. % to about 5.0 wt. %. Preferably, the ceria abrasive particles are present in the polishing composition at a concentration of about 0.001 wt. % to about 2.0 wt. %. In some embodiments, the ceria abrasive particles are present in an amount of about 1 wt. % or less, such as from about 0.1 wt. % to about 1 wt. %, e.g., from about 0.1 wt. % to about 0.7 wt. %, about 0.1 wt. % to about 0.5 wt. %, 0.1 wt. % to about 0.3 wt. % (e.g., 0.2 wt. %).

The alcohol amine is included in the polishing composition, in some embodiments to modify the surface properties of the substrate being polished so as to make the substrate surface more receptive to interaction with abrasive particles. The pH of the polishing composition plays an important role in determining the interactions between the polishing composition and the surface of the substrate being polished. An alcohol amine is included in some embodiments to facilitate increasing the pH of the polishing composition to at least about a pH of 6, about 7, or higher (e.g., a pH from about 6 to about 11), without destabilizing the ceria abrasive particles. In this respect, the native ceria particles can have a lower pH (e.g., about 4), and the alcohol amine can act as a primary pH adjustor in the polishing composition to prevent particle growth in the form of agglomerated particles, which would fall out of solution, at a pH of 6. Thus, the presence of the alcohol amine can reduce the onset of agglomeration of ceria abrasive particles and precipitation thereof which might otherwise occur at a pH of about 6.

The pH of the polishing composition can be any suitable pH of at least 6 or more. e.g., about 6.5 or more, about 7 or more, about 7.5 or more, about 8 or more, about 8.5 or more, about 9 or more, about 9.5 or more, or about 10 or more. In addition, the pH of the polishing composition can be 14 or lower, e.g., about 13.5 or lower, about 13 or lower, about 12.5 or lower, about 12 or lower, about 11.5 or lower, about 11 or lower, about 10.5 or lower, about 10 or lower, about 9.5 or lower, about 9 or lower, about 8.5 or lower, or about 8 or lower. Thus, the pH of the polishing composition can be within a range bounded by any of the aforementioned endpoints. For example, the pH of the polishing composition can be about 6 to about 14, e.g., about 6 to about 10, about 6 to about 8, about 6 to about 7, about 7 to about 14, about 7 to about 10, or about 8 to about 12.

In order for the alcohol amine to interact with the substrate within this pH range, in some embodiments, the alcohol amine desirably bears a functional group having a pKa (in water) from about 7 to about 11, such as from about 7.5 to about 10, e.g. from about 8 to about 9, e.g., such that the alcohol amine acts as a base in water. In some embodiments, the alcohol amine has an isolectric point (pKi, also referred to as pI) from about 6 to about 10, such as from about 7.5 to about 9, e.g., from about 6.5 to about 7.

The alcohol amine can be any suitable alcohol amine. Preferably, the alcohol amine is 2-dimethylamino-2-methylpropanol (DMAMP), triethanolamine, diethanolamine, ethanolamine, 2-amino-2-2methyl-1,3propanediol, Bis-Tris, Tris, co-formed products thereof, or combinations thereof.

The alcohol amine can be present in any suitable concentration. For example, the alcohol amine can be present at a concentration of about 0.0005 wt. % or more, e.g., about 0.005 wt. % or more, about 0.01 wt. % or more, about 0.05 wt. % or more, about 0.1 wt. % or more, or about 0.5 wt. % or more. Alternatively, or in addition, the alcohol amine can be present in the polishing composition at a concentration of about 5 wt. % or less, e.g., about 4 wt. % or less, about 3 wt. % or less, about 2 wt. % or less, or about 1 wt. % or less. Thus, the alcohol amine can be present in the polishing composition at a concentration within a range bounded by any two of the aforementioned endpoints. For example, the alcohol amine can be present at a concentration from about 0.005 wt. % to about 5 wt. %, e.g., from about 0.01 wt. % to about 3 wt. %, from about 0.1 wt % to about 2 wt. %, from about 0.005 wt. % to about 4 wt. %, or from about 0.05 wt. % to about 1 wt. %. Preferably, the alcohol amine is present in the polishing composition at a concentration from about 0.001 wt. % to about 1 wt. %.

The pH of the polishing composition can be achieved and/or maintained by any suitable means. More specifically, the polishing composition can further comprise a secondary pH adjustor used alone or in conjunction with an alcohol amine, a pH buffering agent, or combination thereof. The secondary pH adjuster can be any suitable pH-adjusting compound, for example any suitable acid. Typically, the acid is acetic acid, nitric acid, phosphoric acid, oxalic acid, and combinations thereof. Preferably, the acid is nitric acid. The secondary pH adjustor can alternatively be a base. The base can be any suitable base. Typically, the base is potassium hydroxide, ammonium hydroxide, and combinations thereof. The pH buffering agent can be any suitable buffering agent. For example, the pH buffering agent can be a phosphate, sulfate, acetate, borate, ammonium salt, and the like. The polishing composition can comprise any suitable amount of a pH adjustor and/or a pH buffering agent, provided that a suitable amount is used to achieve and/or maintain the pH of the polishing composition within the pH ranges set forth herein.

Optionally, in some embodiments, the polishing composition can include one or more nonionic surfactants. The nonionic surfactant can be any suitable nonionic surfactant. Preferably, the nonionic surfactant is polysorbate, polysorbate 20, polysorbate 60, polysorbate 65, polysorbate 80, polysorbate 85, sorbitan, polyoxyethylene ether, ethoxylate, acrylic, polyether polyol, hydropalat 3233, sorbitan monolaurate, polyoxyethylene (40) nonylphenyl ether, pentaerythritol ethoxylate, glycerol propoxylate-block-ethoxylate, acrylic copolymer, polypropylene oxide-based triol, co-formed products thereof, or combinations thereof. In some embodiments, the nonionic polymer functions as a surfactant and/or wetting agent. The presence of the nonionic surfactant advantageously allows for useful removal rates for dielectric layers (e.g., oxides) while reducing removal rates for polysilicon. Additionally, the presence of nonionic surfactant, in some embodiments of the invention, allows for low dishing. Furthermore, in some embodiments of the invention, the presence of nonionic surfactant allows for low defectivity on the substrate being polished.

If present in the polishing composition, the nonionic surfactant can be present at any suitable concentration in the polishing composition. For example, the nonionic surfactant can be present at a concentration of about 0.0005 wt. % or more, e.g., about 0.005 wt. % or more, about 0.01 wt. % or more, about 0.05 wt. % or more, about 0.1 wt. % or more, or about 0.5 wt. % or more. Alternatively, or in addition, the nonionic surfactant can be present in the polishing composition at a concentration of about 5 wt. % or less, e.g., about 4 wt % or less, about 3 wt. % or less, about 2 wt. % or less, or about 1 wt. % or less. Thus, the nonionic surfactant can be present in the polishing composition at a concentration in a range bounded by any two of the aforementioned endpoints. For example, the nonionic surfactant can be present at a concentration from about 0.005 wt. % to about 5 wt. %, e.g., from about 0.01 wt. % to about 3 wt. %, from about 0.1 wt. % to about 2 wt. %, from about 0.005 wt. % to about 4 wt. %, or from about 0.05 wt. % to about 1 wt. %. Preferably, the nonionic surfactant is present in the polishing composition at a concentration from about 0.001 wt. % to about 1 wt. %.

The nonionic surfactant can have any suitable hydrophobic lipophilic balance (HLB). For example, the nonionic surfactant can have an HLB of about 3 or more, e.g., about 4 or more, about 5 or more, about 6 or more, about 7 or more, about 8 or more, about 9 or more, about 10 or more, or about 11 or more. Alternatively, or in addition, the nonionic surfactant can have an HLB of about 22 or less, e.g., about 21 or less, about 20 or less, about 19 or less, about 18 or less, about 17 or less, about 16 or less, about 15 or less, about 14 or less, about 13 or less, or about 12 or less. Thus, the nonionic surfactant can have an HLB in a range bounded by any two of the aforementioned endpoints. For example, the nonionic surfactant can have an HLB from about 3 to about 22, from about 4 to about 21, from about 5 to about 20, from about 6 to about 19, from about 10 to about 13, or from about 8 to about 15. Preferably, the nonionic surfactant has an HLB from about 7 to about 18.

Optionally, in some embodiments, the polishing composition can include one or more thickeners. The thickener can be included, for example, to serve as a dishing reducer. The thickener can be any suitable thickener. Preferably, the thickener is a cellulosic compound, dextran, polyvinyl alcohol, carrageenan, chitosan, hydroxyethylcellulose, carboxyethylcellulose, hydroxymethylcellulose, methylcellulose, hydroxypropylcellulose, co-formed products thereof, or combinations thereof.

If present in the polishing composition, the thickener can be present at any suitable concentration in the polishing composition. For example, the thickener can be present at a concentration of about 0.0005 wt. % or more, e.g., about 0.005 wt. % or more, about 0.01 wt. % or more, about 0.05 wt. % or more, about 0.1 wt. % or more, or about 0.5 wt. % or more. Alternatively, or in addition, the thickener can be present in the polishing composition at a concentration of about 5 wt. % or less, e.g., about 4 wt. % or less, about 3 wt. % or less, about 2 wt. % or less, or about 1 wt. % or less. Thus, the thickener can be present in the polishing composition at a concentration in a range bounded by any two of the aforementioned endpoints. For example, the thickener can be present at a concentration from about 0.005 wt. % to about 5 wt. %, e.g., from about 0.01 wt. % to about 3 wt. %, from about 0.1 wt. % to about 2 wt. %, from about 0.005 wt. % to about 4 wt. %, or from about 0.05 wt. % to about 1 wt. %. Preferably, the thickener is present in the polishing composition at a concentration from about 0.001 wt. % to about 1 wt. %.

Optionally, in some embodiments, the polishing composition can include one or more cationic polymers, for example, to serve as removal rate promoters, defectivity reducers, or both. The cationic polymer can be any suitable cationic polymer. Preferably, the cationic polymer is poly(methacryloxyethyltrimethyammonium) chloride (polyMADQUAT), poly(diallyldimethylammonium) chloride (polyDADMAC), poly(acrylamide), poly(allylamine), poly(vinylimmidazolium), poly(vinylpyridium), co-formed products thereof, or combinations thereof.

If present in the polishing composition, the cationic polymer can be present at any suitable concentration in the polishing composition. For example, the cationic polymer can be present at a concentration of about 0.0005 wt. % or more, e.g., about 0.005 wt. % or more, about 0.01 wt. % or more, about 0.05 wt. % or more, about 0.1 wt % or more, or about 0.5 wt. % or more. Alternatively, or in addition, the cationic polymer can be present in the polishing composition at a concentration of about 5 wt. % or less, e.g., about 4 wt. % or less, about 3 wt. % or less, about 2 wt. % or less, or about 1 wt. % or less. Thus, the cationic polymer can be present in the polishing composition at a concentration in a range bounded by any two of the aforementioned endpoints. For example, the cationic polymer can be present at a concentration from about 0.005 wt. % to about 5 wt. %, e.g., from about 0.01 wt. % to about 3 wt. %, from about 0.1 wt. % to about 2 wt. %, from about 0.005 wt. % to about 4 wt. %, or from about 0.05 wt. % to about 1 wt. %. Preferably, the cationic polymer is present in the polishing composition at a concentration from about 0.001 wt. % to about 1 wt. %.

Optionally, the polishing composition further comprises one or more additives. Illustrative additives include conditioners, acids (e.g., sulfonic acids), complexing agents (e.g., anionic polymeric complexing agents), chelating agents, biocides, scale inhibiters, dispersants, etc.

The biocide can be any suitable biocide and can be present in the polishing composition in any suitable amount. A suitable biocide is an isothuazolinone biocide. The amount of biocide used in the polishing composition typically is about 1 to about 50 ppm, preferably about 10 to about 20 ppm.

The polishing composition can be prepared by any suitable technique, many of which are known to those skilled in the art. The polishing composition can be prepared by batch or continuous process. Generally, the polishing composition can be prepared by combining the components described herein in any order. The term "component" as used herein includes individual ingredients (e.g., ceria abrasive, alcohol amine, water, optional nonionic surfactant, optional thickener, optional cationic polymer, and/or any optional additive) as well as any combination of ingredients (e.g., ceria abrasive, alcohol amine, water, optional nonionic surfactant, optional thickener, optional cationic polymer, etc.).

For example, the polishing composition can be prepared by (i) providing all or a portion of the liquid carrier, (ii) dispersing the ceria abrasive, alcohol amine, water, optional nonionic surfactant, optional thickener, optional cationic polymer, and/or any optional additive, in the liquid carrier using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., water, optional nonionic surfactant, optional thickener, optional cationic polymer, and/or any optional additive) in a cerium oxide slurry, (ii) providing one or more components in an additive solution (e.g., water, optional nonionic surfactant, optional thickener, optional cationic polymer, and/or any optional additive), (iii) combining the cerium oxide slurry and the additive solution to form a mixture, (iv) optionally adding suitable amounts of any other optional additives to the mixture, and (v) adjusting the pH of the mixture as appropriate.

The polishing composition can be supplied as a one-package system comprising a ceria abrasive, alcohol amine, optional nonionic surfactant, optional thickener, optional cationic polymer, and/or any optional additive, and water. Alternatively, the polishing composition can be supplied as a two-package system comprising a cerium oxide slurry and an additive solution, wherein the ceria oxide slurry consists essentially of, or consists of, a ceria abrasive, optional nonionic surfactant, optional thickener, optional cationic polymer, and/or any optional additive. The two-package system allows for the adjustment of substrate global flattening characteristics and polishing speed by changing the blending ratio of the two packages, i.e., the cerium oxide slurry and additive solution.

Various methods can be employed to utilize such a two-package polishing system. For example, the cerium oxide slurry and additive solution can be delivered to the polishing table by different pipes that are joined and connected at the outlet of supply piping. The cerium oxide slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad or the substrate surface itself). As utilized herein the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 s or less, about 30 s or less, about 10 s or less prior to being added in mixed form onto the platen, or simultaneously to the delivery of the components at the point-of-use (e.g., the components are combined at a dispenser). Components also are combined "immediately before delivery to the point-of-use" if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the ceria abrasive, alcohol amine, optional nonionic surfactant, optional thickener, optional cationic polymer, and/or any optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the ceria abrasive, alcohol amine, optional nonionic surfactant, optional thickener, optional cationic polymer and/or any optional additive are at least partially or fully dissolved in the concentrate.

Embodiments of the invention also provide methods for polishing a substrate with an embodiment of the polishing composition described herein. The method of polishing a substrate comprises (i) providing a substrate, (ii) providing a polishing pad, (iii) providing a polishing composition according to an embodiment of the invention, (iv) contacting the substrate with the polishing pad and polishing composition, and (v) moving the polishing pad and the polishing composition relative to the substrate to abrade at least a portion of the substrate to polish the substrate.

In particular, some embodiments of the method comprise contacting a substrate with a polishing pad and a polishing composition comprising (a) wet-process ceria abrasive particles having an average particle size of about 30 nm or less, (b) at least one alcohol amine, and (c) water. The polishing composition has a pH of about 6 or more. The method further comprises moving the polishing pad and the polishing composition relative to the substrate to abrade at least a portion of the substrate to polish the substrate.

In the contacting step, the polishing composition is presented in a suitable quantity as will be appreciated by one of ordinary skill in the art.

The abrading step is conducted for a suitable amount of time, e.g., to achieve the desired polishing of the substrate.

The polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon oxide and/or polysilicon, such that some portion of the silicon oxide and/or polysilicon is removed from the substrate to polish the substrate. The dielectric layer (e.g., silicon oxide) to be polished with the inventive polishing composition can have any suitable dielectric constant, such as a dielectric constant of about 3.5 or less, e.g., about 3 or less, about 2.5 or less, about 2 or less, about 1.5 or less, or about 1 or less. Alternatively, or in addition, the dielectric layer can have a dielectric constant of about 1 or more, e.g. about 1.5 or more, about 2 or more, about 2.5 or more, about 3 or more, or about 3.5 or more. Thus, the dielectric layer can have a dielectric constant within a range bounded by any two of the foregoing endpoints. For example, the dielectric layer can have a dielectric constant between about 1 and about 3.5, e.g., between about 2 and about 3, between about 2 and about 3.5, between about 2.5 and about 3, between about 2.5 and about 3.5.

In certain embodiments, the substrate comprises polysilicon in combination with silicon oxide and/or silicon nitride. The polysilicon can be any suitable polysilicon, many of which are known in the art. The polysilicon can have any suitable phase and can be amorphous, crystalline, or a combination thereof. The silicon oxide similarly can be any suitable silicon oxide, many of which are known in the art. Suitable types of silicon oxide include but are not limited to borophosposphosilicate glass (BPSC), plasma-enhanced tetraethyl orthosilicate (PETEOS), tetraethyl orthosilicate (TEOS), thermal oxide, undoped silicate glass, and high density plasma (HDP) oxide.

The polishing composition desirably exhibits a high removal rate when polishing a substrate comprising silicon oxide according to a method of the invention. For example, when polishing silicon wafers comprising high density plasma (HDP) oxides and/or plasma-enhanced tetraethyl ortho silicate (PETEOS), spin-on-glass (SOG) and/or tetraethyl orthosilicate (TEOS) in accordance with an embodiment of the invention, the polishing composition desirably exhibits a silicon oxide removal rate of about 400 Å/min or higher, e.g., about 700 Å/min or higher, about 1,000 Å/min or higher, about 1,250 Å/min or higher, about 1,500 Å/min or higher, about 1,750 Å/min or higher, about 2,000 Å/min or higher, about 2,500) Å/min or higher, about 3,000 Å/min or higher, about 3,500 Å/min or higher about 4000 Å/min or higher, about 4500 Å/min or higher, or about 5000 Å/min or higher.

The polishing composition desirably exhibits a low removal rate when polishing a substrate comprising polysilicon and/or silicon nitride according to a method of the invention. For example, when polishing silicon wafers comprising polysilicon in accordance with an embodiment of the invention, the polishing composition desirably exhibits a removal rate of polysilicon and/or silicon nitride of about 1,000 Å/min or lower, e.g., about 750 Å/min or lower, about 500 Å/min or lower, about 250 Å/min or lower, about 100 Å/min or lower, about 50 Å/min or lower, about 25 Å/min or lower, about 10 Å/min or lower, or even about 5 Å/min or lower.

For example, in some embodiments, polishing compositions and methods of the invention are useful in applications having polysilicon squares separated by silicon oxide trenches. In some embodiments, the polishing composition can be used for stop-on-poly (SOP) applications such as for "NAND flash" polishing for non-volatile memory devices which are susceptible to defects such as scratches. Desirably, in some embodiments, use of polishing compositions and methods according to the invention can enhance the yield of wafers to at least about 90%, e.g., at least about 92%, or at least about 95%.

The polishing composition desirably exhibits low dishing when polishing a substrate, as determined by suitable techniques. For example, when polishing patterned silicon wafers including trenches filled with a dielectric layer (e.g., oxide) with an embodiment of the invention, the polishing composition desirably exhibits dishing of about 2500 Å or lower, e.g., about 2000 Å or lower, about 1750 Å or lower, about 150 Å or lower, about 1250 Å or lower, about 1000 Å or lower, about 750 Å or lower, about 500 Å or lower, about 250 Å or lower, about 100 Å or lower, about 50 Å or lower, or about 25 Å or lower.

The polishing composition desirably exhibits low particle defects when polishing a substrate, as determined by suitable techniques. Particle defects on a substrate polished with the inventive polishing composition can be determined by any suitable technique. For example, laser light scattering techniques, such as dark field normal beam composite (DCN) and dark field oblique beam composite (DCO), can be used to determine particle defects on polished substrates. Suitable instrumentation for evaluating particle defectivity is available from, for example, KLA-Tencor (e.g., SURFSCAN™ SP1 instruments operating at a 120 nm threshold or at 160 nm threshold).

A substrate, especially silicon comprising silicon oxide and/or polysilicon polished with the polishing composition desirably has a DCN value of about 20,000 counts or less, e.g., about 17,500 counts or less, about 15,000 counts or less, about 12,500 counts or less, about 3,500 counts or less, about 3,000 counts or less, about 2,500 counts or less, about 2,000 counts or less, about 1,500 counts or less, or about 1,000 counts or less. Preferably, a substrate polished in accordance with an embodiment of the invention has a DCN value of about 750 counts or less, e.g., about 500 counts, about 250 counts, about 125 counts, or even about 100 counts or less.

A substrate polished with an embodiment of the polishing composition desirably exhibits low total scratch count as determined by suitable techniques. For example, when the polishing composition desirably exhibits a total scratch count of about 90 counts or less, e.g., about 80 counts or less, about 70 counts or less, about 60 counts or less, about 50 counts or less, about 40 counts or less, about 30 counts or less, about 20 counts or less, about 10 counts or less, about 5 counts or less, about 2 counts or less, or about 1.5 counts or less.

When polishing a polysilicon substrate with an embodiment of the polishing composition, polysilicon loss from a substrate can be measured from the edge, middle, and center of the polysilicon substrate. The polishing composition desirably exhibits uniformity of polysilicon loss when polishing a substrate, as determined by suitable techniques. For example, the polysilicon loss values from the edge, middle, and center of a polysilicon substrate are desirably within about 50 Å of one another, e.g., within about 40 Å of one another, within about 30 Å of one another, within about 20 Å of one another, within about 10 Å of one another, within about 5 Å of one another, within about 2.5 Å of one another, within about 1.0 Å of one another, or within about 0.1 Å of one another.

The polishing composition can be tailored to provide effective polishing selective to specific materials, while at the same time minimizing surface imperfections, defects, corrosion, erosion and the removal of stop layers. The selectivity can be controlled, to some extent, by altering the relative concentrations of the components of the polishing composition. When desirable, the polishing composition can be used to polish a substrate with a silicon dioxide to polysilicon polishing selectivity of about 5:1 or higher, e.g., about 10:1 or higher, about 15:1 or higher, about 25:1 or higher, about 50:1 or higher, about 100:1 or higher, or about 150:1 or even higher. Certain formulations can exhibit even higher silicon oxide to polysilicon selectivities, such as about 20:1 or higher, or even about 30:1 or higher. For example, the removal rate (Å/min) for silicon oxide may be 10 times, or more, higher as compared to the removal rate for polysilicon.

In accordance with the invention, a substrate can be planarized or polished with the polishing composition described herein by any suitable technique. The polishing methods of the invention are particularly suited for use in conjunction with a CMP apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. Embodiments of the polishing composition of the invention allow for increased platen speeds (e.g., about 50 rpm or greater, such as about 100 rpm or greater.) The polishing of the substrate takes place by the substrate being placed in contact with the polishing composition of the invention and desirably a polishing pad and then abrading at least a portion of the surface of the substrate, e.g., one or more of the substrate materials described herein, with the polishing composition to polish the substrate.

A substrate can be polished with the polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, conformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 (commercially available from, for example, Eminess Technologies), POLITEX™, and Fujibo POLYPAS™ 27. A particularly preferred polishing pad is the EPIC™ D100 pad commercially available from Cabot Microelectronics.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651. U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

Example 1

This example demonstrates the effects of pH, DM AMP, polysorbate, and wet-process ceria abrasive particles of an average particle size of 30 nm or less on the removal rate of silicon oxide from homogenous silicon oxide films (blanket wafers) polished with Polishing Compositions 1A-1I. The polishing compositions in this example comprised 6000 ppm polyethylene glycol (PEG) 8000, varying amounts of polysorbate 20 and DMAMP-80 (as set forth in Table 1A), and 2.4% wet process ceria abrasive particles of an average particle size of 30 nm or less. Additionally, the pH values of the polishing compositions are listed in Table 1A. All combinations were tested at 0.43% solids.

Blanket wafers of tetraethyl orthosilicate (TEOS) and high density plasma (HDP) were polished with Polishing Compositions 1A-1I on a Mirra™ CMP apparatus (Applied Materials, Inc., Santa Clara, Calif.). The polishing parameters of the Mirra™ process are set forth in Table 1B below.

Following polishing, the HDP removal rates for each polishing composition were measured in Å/min. The results are illustrated in FIG. 1, which is a cube plot illustrating the HDP removal rate generated at a given polishing composition's pH (X-axis), DMAMP level (Y-axis), and tween-20 level (Z-axis).

TABLE 1A

Polishing Composition Summary

| Polishing Composition | Polishing Composition pH | DMAMP (ppm) | Polysorbate 20 (ppm) |
|---|---|---|---|
| 1A | 8.5 | 2000 | 400 |
| 1B | 8.5 | 1200 | 100 |
| 1C | 9.5 | 1200 | 400 |
| 1D | 9.5 | 2000 | 100 |
| 1E | 8.5 | 2000 | 100 |
| 1F | 8.5 | 1200 | 400 |
| 1G | 9.5 | 2000 | 400 |
| 1H | 9.5 | 1200 | 100 |
| 1I | 9.0 | 1600 | 250 |

TABLE 1B

Mirra ™ Process Parameters

| Parameter | Value |
|---|---|
| Retaining Ring Pressure | 37.9 kPa (5.5 psi) |
| Membrane Pressure | 20.7 kPa (3 psi) |
| Head Speed | 85 rpm |
| Platen Speed | 100 rpm |
| Flow Rate | 150 ml/min |
| Conditioner | Model S8031C7 (Saesol Diamond Ind., Co., Ltd., Korea) |
| Conditioner Downforce | 1.361 kg |
| Conditioning | 100% in situ |
| Polishing Pad | Dow IC1010 ™ polishing pad |

These results demonstrate that higher silicon oxide removal rates were obtained for polishing compositions with higher DMAMP levels. In particular, Polishing Composition 1G exhibited a removal rate approximately four times higher than Polishing Composition 1C. The only difference in the two polishing compositions was that the DMAMP ppm of Polishing Composition 1G was five times greater than Polishing Composition 1C.

The results also demonstrate that a lower pH is optimal for higher removal rates. In particular, Polishing Composition 1B had a removal rate over ten times higher than Polishing Composition 1H. The only difference in the two polishing compositions was that Polishing Composition 1B was more acidic.

Additionally, the results show that higher polysorbate 20 levels increase silicon oxide removal rates. In particular, Polishing Composition 1C exhibited a removal rate approximately seven times higher than Polishing Composition 1H. The only difference in the two polishing compositions was the polysorbate 20 ppm was four times greater in Polishing Composition 1C.

Example 2

This example demonstrates the effects of polysorbate, triethanolamine, and wet process ceria abrasive particles of an average particle size of 30 nm or less on the removal rate of silicon oxide from TEOS blanket wafers polished with Polishing Compositions 2A-2E. Additionally, this example measured the dishing Polishing Compositions 2A-2E create within silicon oxide filled trenches patterned into a polysilicon film (pattern wafers) polished with Polishing Compositions 2A-2E. The polishing compositions in this example comprised 6000 ppm polyethylene glycol (PEG) 8000, varying amounts of removal rate promoters triethanolamine and polysorbate 20 (as set forth in Table 2A), and 2.4% wet process ceria abrasive particles of an average particle size of 30 nm or less. All combinations were tested at 0.43% solids.

Blanket wafers of TEOS were polished with polishing compositions 2A-2E. Additionally, pattern wafers were polished with Polishing Compositions 2A-2E. Polishing was performed on a Reflexion™ CMP apparatus (Applied Materials, Inc., Santa Clara, Calif.). The polishing parameters of the Reflexion™ process are set forth in Table 2B below.

Dishing was measured by an F5 ellipsometry device (KLA-Tencor, Milpitas, Calif.) by comparing the difference in thickness between the silicon oxide film within a trench and the surrounding polysilicon film, wherein a larger difference corresponds to a higher dishing rate.

Figure 2:
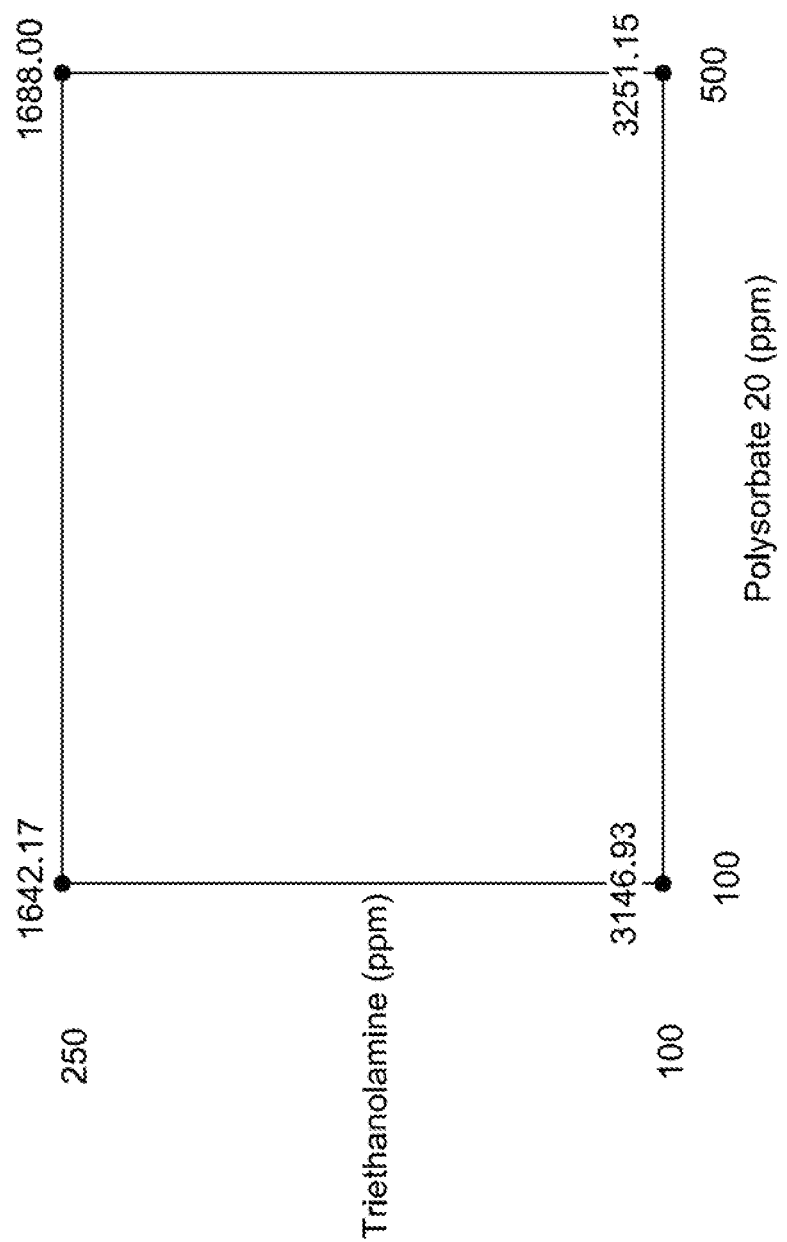
FIG. 2 is a square plot of tetraethyl orthosilicate (TEOS) removal rates of the polishing compositions of Example 2 herein versus polysorbate 20 concentration (X-axis) and triethanolamine concentration (Y-axis).

Following polishing, the TEOS removal rates were measured in Å/min, the results of which are illustrated in FIG. 2, which is a plot illustrating the TEOS removal rate generated at the polysorbate 20 level (X-axis), and triethanolamine (Y-axis) level for a given polishing composition.

Figure 3:
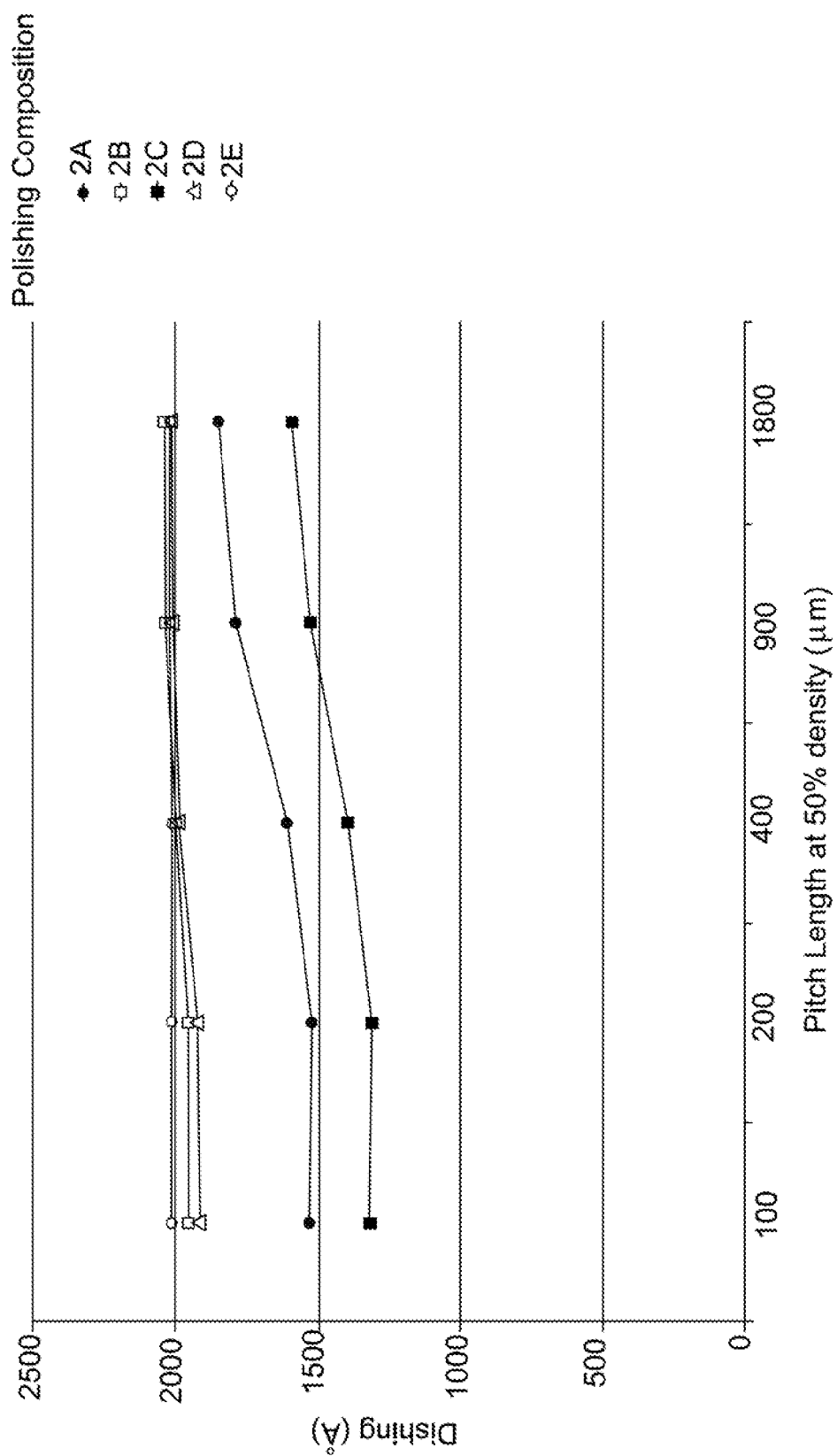
FIG. 3 is a line graph of dishing (Y-axis) versus pitch length at 50% density (X-axis) of the polishing compositions of Example 2 herein.

Dishing exhibited by each polishing composition was measured in Å and illustrated in FIG. 3, which is a line graph displaying dishing (Y-axis) measured within pitches of varying length at 50% density (X-axis) for each polishing composition.

TABLE 2A

Polishing Composition Summary

| Polishing Composition | Polysorbate 20 (ppm) | Triethanolamine (ppm) |
|---|---|---|
| 2A | 100 | 250 |
| 2B | 500 | 250 |
| 2C | 500 | 100 |
| 2D | 100 | 100 |
| 2E | 300 | 175 |

TABLE 2B

Reflexion ™ Process Parameters

| Parameter | Value |
|---|---|
| Retaining Ring Pressure | 55.2-62.1 kPa |
| Zone 1 | 34.5-55.2 kPa |
| Zone 2 | 13.8-27.6 kPa |
| Zone 3 | 20.7 kPa |
| Head Speed | 65-87 rpm |
| Platen Speed | 70-93 rpm |
| Flow Rate | 250 ml/min |
| Conditioner | Model S8031C7 (Saesol Diamond Ind., Co., Ltd., Korea) |
| Conditioner Downforce | 1.361 kg |
| Conditioning | 100% in situ |
| Pad Type | Dow IC1010 ™ polishing pad |

These results demonstrate that higher TEOS removal rates are achieved for polishing compositions with lower triethanolamine levels irrespective of the amount of polysorbate present a given polishing composition. In particular, Polishing Compositions 2D and 2C had comparable TEOS removal rates, even though Polishing Composition 2C included five times the amount of polysorbate 20. Furthermore, the results demonstrate that a higher pH is detrimental to removal rate, as higher triethanolamine contributed to producing higher pH levels and lower removal rates for certain polishing compositions, as demonstrated when comparing Polishing Compositions 2A and 2B.

Additionally, the results demonstrate that the polishing compositions in Table 2A exhibit poor dishing performance. More specifically, FIG. 3 plots the dishing within various pitch sizes (measured in microns) at 50% density. At even the smallest pitch sizes, all polishing compositions exhibited dishing above 1000 Å. Polishing Composition 2B had the lowest dishing at various micron pitch sizes, suggesting that higher levels of polysorbate 20 reduce dishing in silicon oxide trenches.

Example 3

This example demonstrates the effects of various nonionic surfactants, Igepal CO-890, Igepal CA-630, and wet-process ceria abrasive particles of an average particle size of 30 nm or less on 1) the removal rate of silicon oxide from blanket wafers polished with Polishing Compositions 3A-3L; 2) the removal rate of polysilicon from homogenous polysilicon film (polysilicon blanket wafers) polished with Polishing Compositions 3A-3L; and 3) the dishing of Polishing Compositions 3A-3L on pattern wafers. The polishing compositions in this example comprised 6000 ppm PEG 8000, various types of non-ionic surfactants (as set forth in Table 3), 1000 ppm Igepal CO-890, and 2.4% wet process ceria abrasive particles of an average particle size of 30 nm or less. All combinations were tested at 0.43% solids. (In Polishing Compositions 3K and 3L Igepal CA-630 (1000 and 2000 ppm respectively) was substituted for the 1000 ppm Igepal CO-890).

The hydrophobic-lipophilic balance (HLB), is also listed for each nonionic surfactant in Table 3.

Blanket wafers of TEOS, HDP, and polysilicon were polished with the Polishing Compositions 3A-3L. Additionally, pattern wafers were polished with Polishing Compositions 3A-3L. Polishing was performed on a Mirram CMP apparatus (Applied Materials. Inc., Santa Clara, Calif.). Dishing was measured by an F5 ellipsometry device (KLA-Tencor, Milpitas, Calif.).

Figure 4:
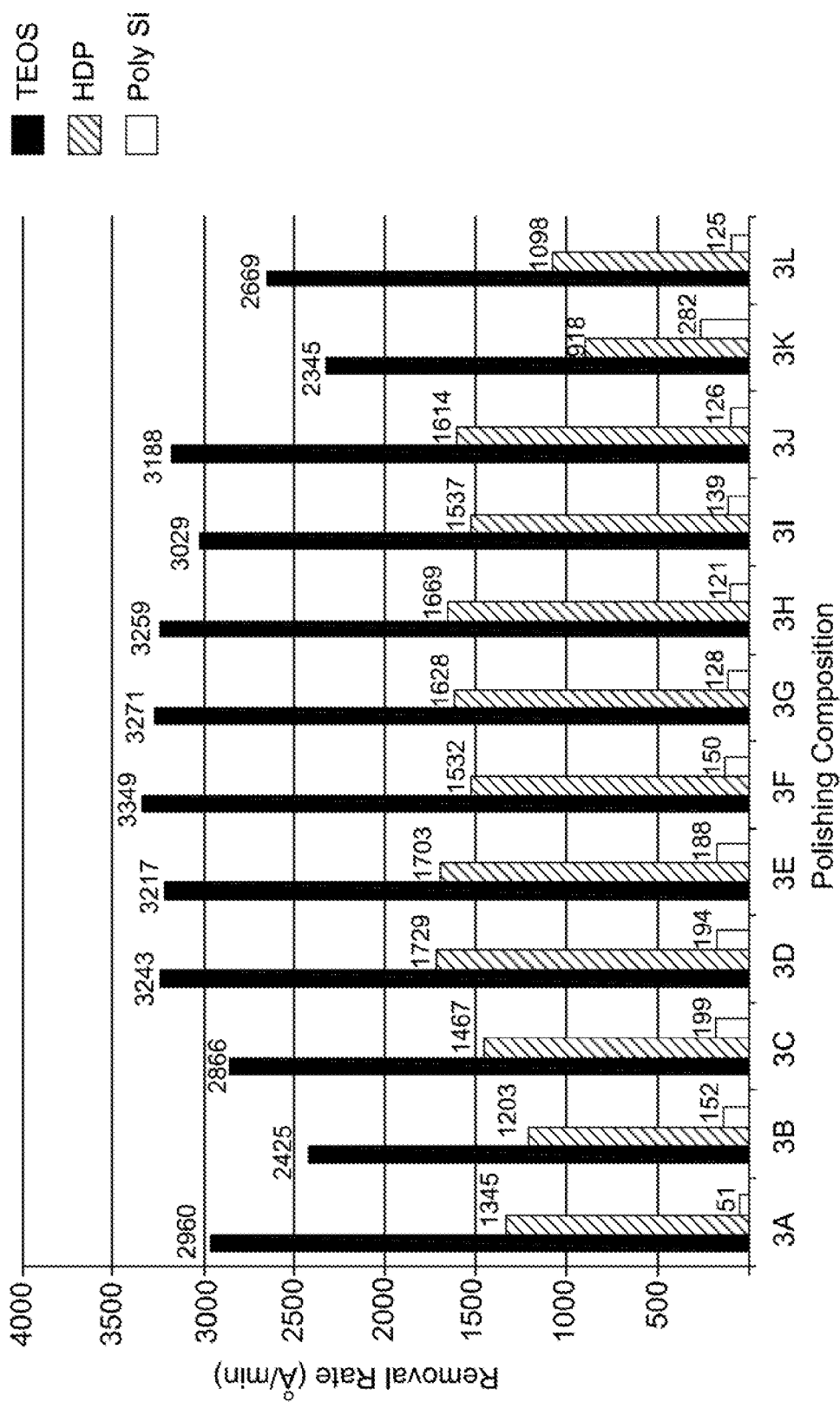
FIG. 4 is a bar graph of TEOS, HDP, and polysilicon removal rates (Y-axis) of the polishing compositions of Example 3 herein (X-axis).

Following polishing the TEOS, HDP, and polysilicon removal rates for each polishing composition were measured in Å/min. The results are illustrated in FIG. 4, which is a bar graph displaying the removal rate (Y-axis) of the three surface wafer types for a particular polishing composition (X-axis).

Figure 5:
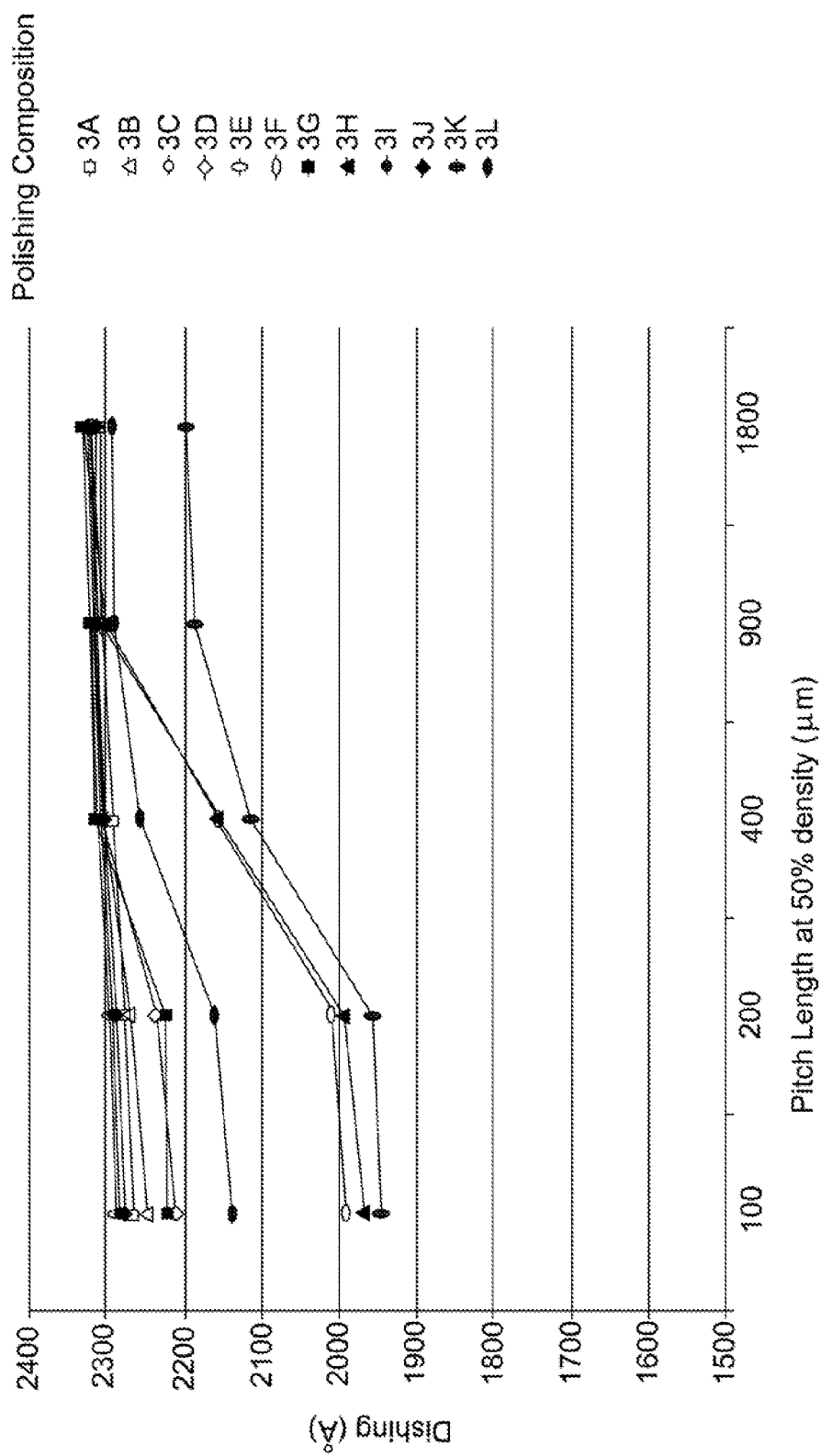
FIG. 5 is a line graph of dishing (Y-axis) versus pitch length at 50% density (X-axis) of the polishing compositions of Example 3 herein.

Dishing exhibited by each polishing composition was measured in Å and illustrated in FIG. 5, which is a line graph illustrating dishing (Y-axis) measured within pitches of varying length (X-axis) for each polishing composition.

TABLE 3

Polishing Composition Summary

| Polishing Composition | Type of Nonionic Surfactant | Nonionic Surfactant Level (wt. %) | HLB of Nonionic Surfactant |
|---|---|---|---|
| 3A | Polysorbate 20 | 0.05 | 16 |
| 3B | Polysorbate 20 | 0.1 | 16 |
| 3C | Polysorbate 60 | 0.0666 | 14-15 |
| 3D | Polysorbate 60 | 0.1332 | 14-15 |
| 3E | Polysorbate 80 | 0.0666 | 15 |
| 3F | Polysorbate 80 | 0.1332 | 15 |
| 3G | Polysorbate 65 | 0.0922 | 10-11 |
| 3H | Polysorbate 65 | 0.1844 | 10-11 |
| 3I | Sorbitan 20 | 0.024 | 8-9 |
| 3J | Sorbitan 20 | 0.048 | 8-9 |
| 3K | Polysorbate 20 | 0.005 | 16 |
| 3L | Polysorbate 20 | 0.005 | 16 |

These results demonstrate that the polishing compositions in Table 3 exhibit high removal rates for silicon oxide while maintaining much lower removal rates for polysilicon. The selectivity that Polishing Compositions 3A-3L exhibit is ideal in CMP compositions. For example, Polishing Composition 3G exhibited silicon oxide removal rates in excess of 1600 Å/min, yet removed polysilicon at a rate of 128 Å/min. The magnitude of the selectivity exhibited by Polishing Composition 3G was exemplified by all polishing compositions in Table 3.

The results also demonstrate that the polishing compositions in Table 3 exhibit poor dishing performance. More specifically, FIG. 5 plots the dishing within various sizes of micron pitch at 50% density. At even the smallest pitch sizes, all polishing compositions demonstrated dishing above 1900 Å. Polishing Compositions 3H and 3J had the lowest dishing at various pitch sizes. This suggests that increased hydrophobicity improves dishing performance, as Polishing Compositions 3H and 3J included the highest amounts of polysorbate 65 and sorbitan 20 respectively, both of which are among the more hydrophobic surfactants used in the polishing compositions of Table 3.

Example 4

This example demonstrates the effects of various cationic polymers, nonionic surfactants, and wet-process ceria abrasive particles of an average particle size of 30 nm or less on silicon oxide removal rate from blanket wafers polished with Polishing Compositions 4A-4K, and polysilicon removal from polysilicon blanket wafers polished with Polishing Compositions 4A-4K. The polishing compositions this example comprised 6000 ppm PEG 8000, various types of branched PEG and polypropylene glycol (PPG) polymers and polysorbate (As set forth in Table 4) and 2.4% wet process ceria abrasive particles of an average particle size of 30 nm or less. All combinations were tested at 0.43% solids. The HLB is also listed for each non-ionic surfactant in Table 4.

Blanket wafers of TEOS, HDP, and polysilicon were polished with the set of Polishing Compositions 4A-4K set forth in Table 4 below. Polishing was performed on a Mirra™ CMP apparatus (Applied Materials, Inc., Santa Clara, Calif.).

Figure 6:
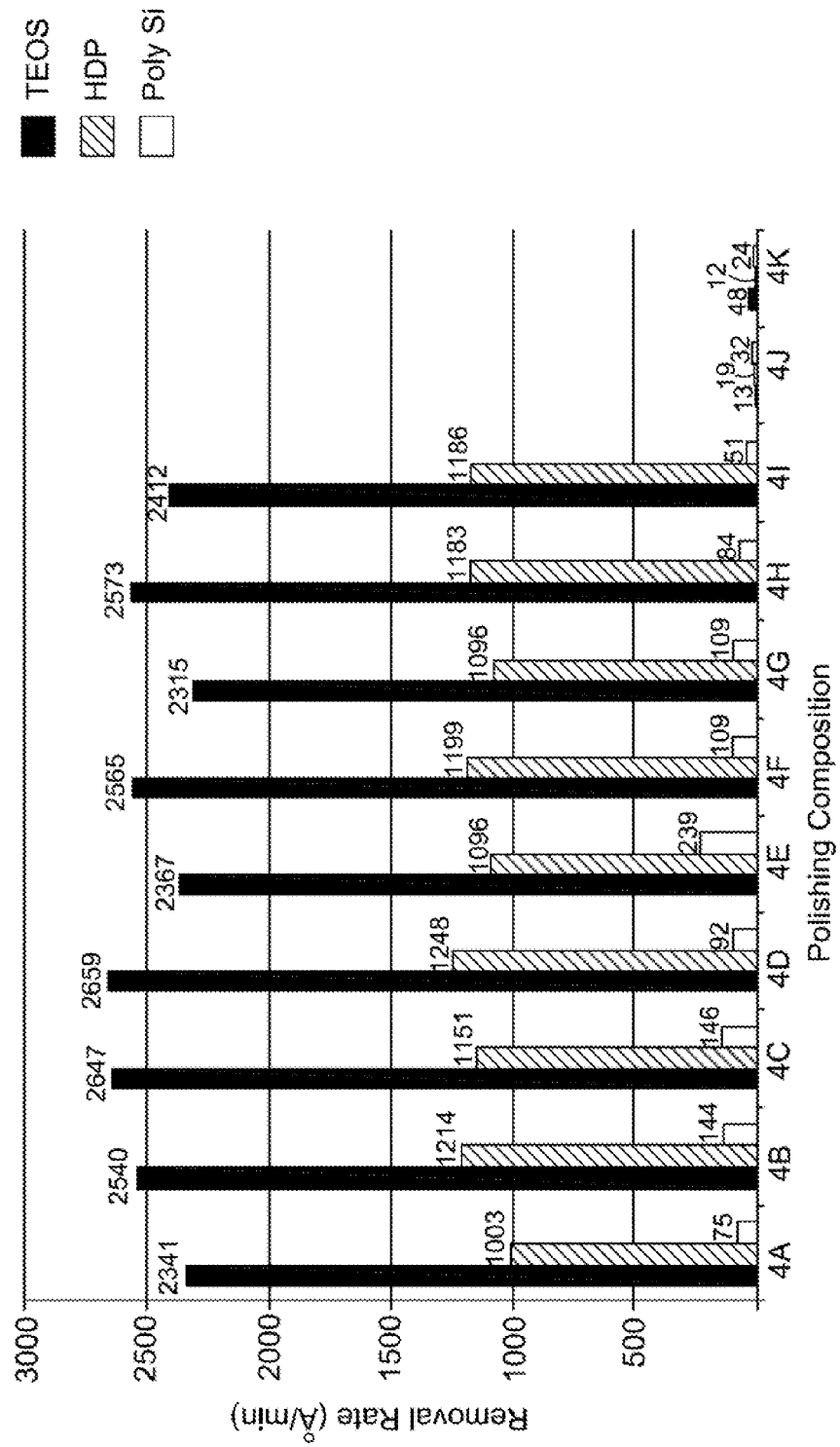
FIG. 6 is a bar graph of TEOS, HDP, and polysilicon removal rates (Y-axis) of the polishing compositions of Example 4 herein (X-axis).

Following polishing, the TEOS, HDP, and polysilicon removal rates for each polishing composition were measured in Å/min. The results are illustrated in FIG. 6, which is a bar graph displaying the removal rate (Y-axis) of the three surface wafer types for a particular polishing composition (X-axis).

TABLE 4

Polishing Composition Summary

| Polishing Composition | Chemical Composition | Polymer | Polymer Level (wt. %) | Polysorbate Type | Polysorbate Level (wt. %) | Polysorbate HLB |
|---|---|---|---|---|---|---|
| 4A | Nonylphenol Ethoxylate Rhodia (Worldwide Locations) | Igepal CO-890 | 0.1 | 20 | 0.05 | 16 |
| 4B | Pentaerythritol ethoxylate (3/4 EO/OH) Jena Bioscience GmbH (Jena, Germany) | Pentaerythritol ethoxylate | 0.025 | 80 | 0.0664 | 15 |
| 4C | Pentaerythritol ethoxylate (3/4 EO/OH) Jena Bioscience GmbH (Jena, Germany) | Pentaerythritol ethoxylate | 0.05 | 80 | 0.0664 | 15 |
| 4D | Glycerol propoxylate-block-ethoxylate Sigma-Aldrich (Saint Louis, MO) | Glycerol propoxylate-block-ethoxylate | 0.025 | 80 | 0.0664 | 15 |
| 4E | Glycerol propoxylate-block-ethoxylate Sigma-Aldrich (Saint Louis, MO) | Glycerol propoxylate-block-ethoxylate | 0.05 | 80 | 0.0664 | 15 |
| 4F | Polyether polyol; 4,200-molecular-weight polypropylene oxide-based triol Bayer (Worldwide Locations) | Acrol Poly LHT-42 | 0.025 | 20 | 0.05 | 16 |
| 4G | Polyether polyol; 4,200-molecular-weight polypropylene oxide-based triol Bayer (Worldwide Locations) | Acrol Poly LHT-42 | 0.05 | 20 | 0.05 | 16 |
| 4H | Polyether polyol; 4,200-molecular-weight polypropylene oxide-based triol Bayer (Worldwide Locations) | Acrol Poly LHT-42 | 0.025 | 80 | 0.0664 | 15 |
| 4I | Polyether polyol; 4,200-molecular-weight polypropylene oxide-based triol Bayer (Worldwide Locations) | Acrol Poly LHT-42 | 0.05 | 80 | 0.0664 | 15 |
| 4J | Acrylic copolymer Croda (Worldwide Locations) | Zephrym PD-4913 | 0.1 | 20 | 0.05 | 16 |

TABLE 4-continued

Polishing Composition Summary

| Polishing Composition | Chemical Composition | Polymer | Polymer Level (wt. %) | Polysorbate Type | Polysorbate Level (wt. %) | Polysorbate HLB |
|---|---|---|---|---|---|---|
| 4K | Acrylic copolymer Croda (Worldwide Locations) | Zephrym PD-4913 | 0.1 | 80 | 0.0664 | 15 |

These results demonstrate that Polishing Compositions 4A-4I generally exhibit high silicon oxide removal rates while simultaneously maintaining low polysilicon removal rates. More specifically, the results indicate that the presence of ethoxylated molecules (e.g., PEG) in Polishing Compositions 4A-4I are responsible for the removal rate data, as the removal rates were consistent among Polishing Compositions 4A-4I irrespective of the amount of polysorbate said polishing compositions included. For example, Polishing Compositions 4F and 4H exhibited nearly identical silicon oxide removal rates and low polysilicon removal rates despite including different types and amounts of polysorbate.

Polishing Compositions 4J and 4K demonstrated extremely low, and thus less ideal silicon oxide removal rates, as well as very low polysilicon removal rates. Polishing Compositions 43 and 4K comprised identical quantities of Zephrym PD-4913, a comb-polymer comprising PEG side chains, which likely accounted for low silicon oxide removal rates in these polishing compositions.

Example 5

This example demonstrates the effects of thickener and wet-process ceria abrasive particles of an average particle size of 30 nm or less on 1) silicon oxide removal rate from blanket wafers polished with Polishing Compositions 5A-5D; 2) polysilicon removal rate from polysilicon blanket wafers polished with Polishing Compositions 5A-5D; and 3) the dishing of Polishing Compositions 5A-5D on pattern wafers. The polishing compositions in this example comprised 6000 ppm PEG 8000, hydroxyethylcellulose and various types of polysorbate (as set forth in Table 5A), and 2.4% wet process ceria abrasive particles of an average particle size of 30 nm or less. All combinations were tested at 0.43% solids Blanket wafers of TEOS, HDP, and polysilicon were polished with the set of Polishing Compositions 5A-5D. Additionally, pattern wafers were polished with Polishing Compositions 5A-5D. Polishing was performed on a Reflexion™ CMP apparatus (Applied Materials, Inc., Santa Clara, Calif.). Dishing was measured by an F5 ellipsometry device (KLA-Tencor, Milpitas, Calif.).

Following polishing, the TEOS, HDP, and polysilicon removal rates for each polishing composition were measured in Å/min. The results are set forth in Table 5B below, which is a chart listing both silicon oxide and polysilicon removal rates in Å/min for each polishing composition. Following polishing, dishing exhibited by each polishing composition was measured in Å and listed in Table 5B.

TABLE 5A

Polishing Composition Summary

| Polishing Composition | Hydroxyethylcellulose Level (wt. %) | Polysorbate Type | Polysorbate Level (wt. %) | Polysorbate HLB |
|---|---|---|---|---|
| 5A | 0.04 | 60 | 0.132 | 14-15 |
| 5B | 0.04 | 80 | 0.198 | 15 |
| 5C | 0.1 | 60 | 0.132 | 14-15 |
| 5D | 0.1 | 80 | 0.198 | 15 |

TABLE 5B

Polishing Performance for polishing compositions 5A-5D

| Polishing Composition | TEOS RR (Å/min) | HDP RR (Å/min) | Poly Si RR (Å/min) | Dishing (Å) |
|---|---|---|---|---|
| 5A | 988 | 550 | 96 | >500 |
| 5B | 19 | 21 | 0 | Not Tested |
| 5C | 1539 | 1027 | 1 | <100 |
| 5D | 1575 | 1118 | 0 | <100 |

These results demonstrate that the presence of the thickening agent hydroxyethylcellulose in Polishing Compositions 5A-5D was responsible the production of substantially lower dishing rates, particularly in Polishing Compositions 5C and 5D. In particular, Polishing Composition 5D exhibited dishing of less than 100 Å while maintaining silicon oxide removal rates above 1000 Å/min and very low polysilicon removal rate. This data indicates that hydroxyethylcellulose provides a solution to the high dishing rates that were present in examples 2 and 3 while maintaining ideal removal rates for both silicon oxide and polysilicon.

While the polishing compositions in this example generally demonstrated ideal removal rates and lower dishing rates, particle residue remained present on the blanket wafer surfaces that were tested. Residue which remains on blanket wafers after polishing is completed inhibits the ability to test the wafer surface for scratches.

Example 6

This example demonstrates the effects of the cationic polymer polyMADQUAT and wet-process ceria abrasive particles of an average particle size of 30 nm or less on 1) silicon oxide removal rate from blanket wafers polished with Polishing Compositions 6A-6D; 2) polysilicon removal rate from polysilicon blanket wafers polished with Polishing Compositions 6A-6D: and 3) the defect counts (DCN) exhibited by Polishing Compositions 6A-6D on blanket wafers. These effects were also compared to a control polishing composition. The polishing compositions in this example comprised 6000 ppm PEG 8000, 660 ppm polysorbate 85, triethanolamine (400 or 60) ppm), the cationic polymer polyMADQUAT (Alco 4773, 20 or 50 ppm), and 2.4% wet process ceria abrasive particles of an average particle size of 30 nm or less. All combinations were tested at 0.43% solids.

Figure 7:
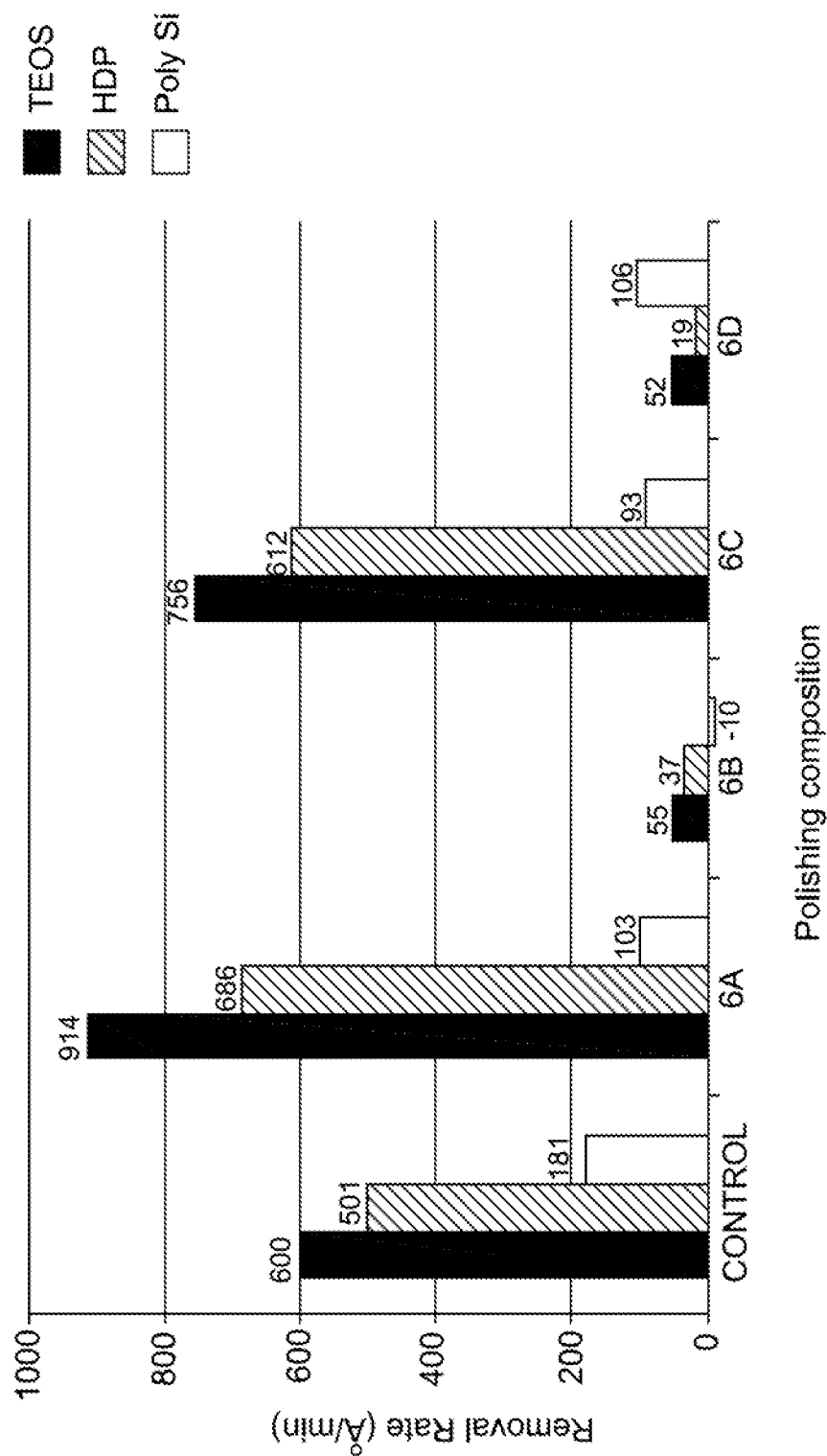
FIG. 7 is a bar graph of TEOS, HDP, and polysilicon removal rates (Y-axis) of various polishing compositions of Example 6 herein (X-axis).
Figure 8:
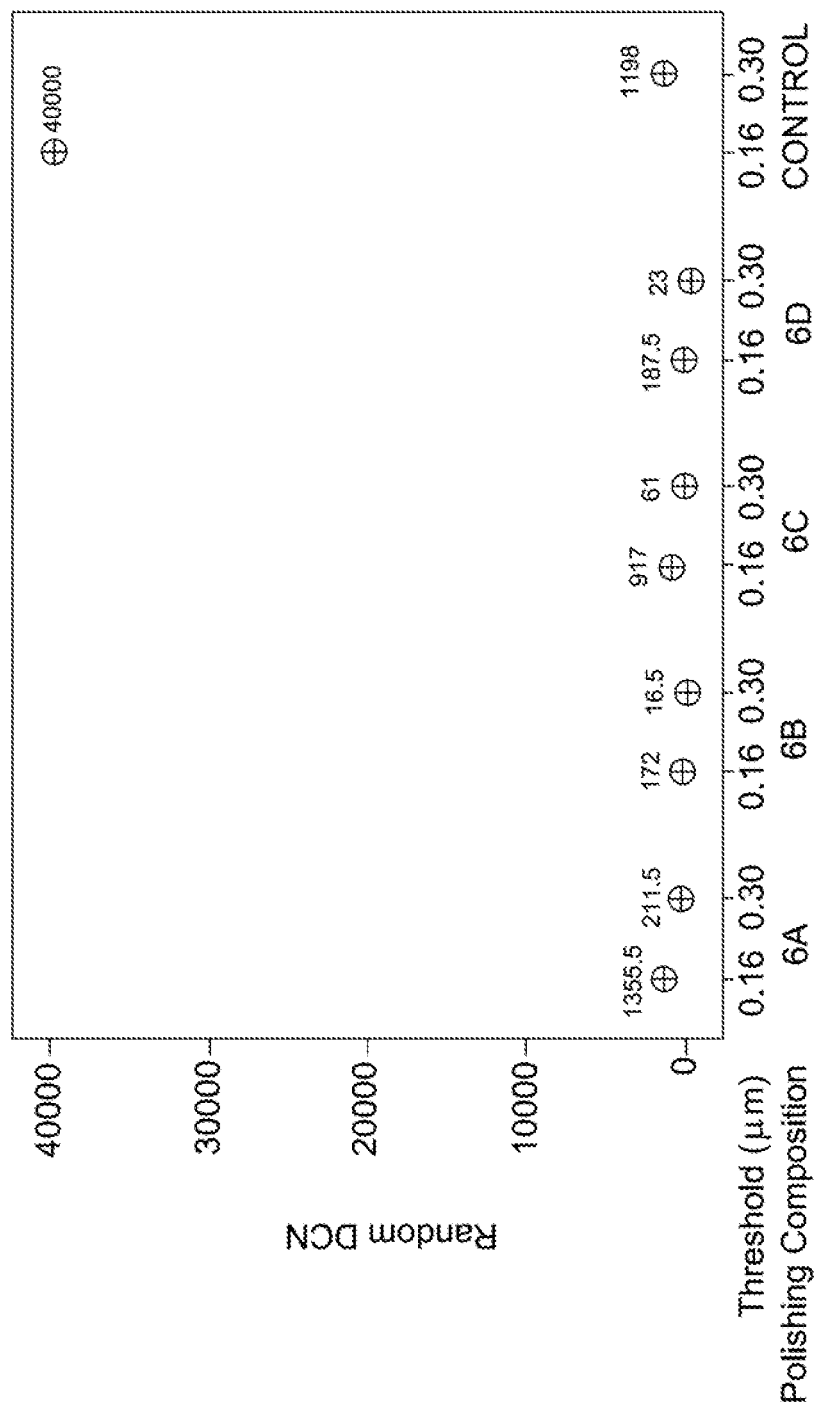
FIG. 8 is a box plot of random defect counts (DCN) of the polishing compositions of Example 6 herein (Y-axis) at different thresholds (X-axis).

The control in FIG. 7 and FIG. 8, comprised 600 ppm hydroxyethylcellulose, 1320 ppm polysorbate 85, and 400 ppm triethanolamine.

Blanket wafers of TEOS, HDP, and polysilicon were polished with the set of Polishing Compositions 6A-6D and the control polishing composition. Polishing was performed on a Mirra™ CMP apparatus (Applied Materials, Inc., Santa Clara, Calif.).

Following polishing, the TEOS, HDP, and polysilicon removal rates for Polishing Compositions 6A-6D and the control polishing composition were measured in Å/min. The results are illustrated in FIG. 7, which is a bar graph displaying the removal rate (Y-axis) of the three surface wafer types for a particular polishing composition (X-axis).

The DCN results are illustrated in FIG. 8, which is a box plot of random defect count (Y-axis) shown at two different thresholds (0.16 and 0.3 microns) for each polishing composition (X-axis). Defect counts were generated using scanning electron microscopy (SEM) to detect scratches on the wafer surfaces after polishing.

TABLE 6

Polishing Composition Summary

| Polishing Composition | polyMADQUAT (ppm) | Triethanolamine (ppm) |
|---|---|---|
| 6A | 20 | 400 |
| 6B | 50 | 400 |
| 6C | 20 | 600 |
| 6D | 50 | 600 |

These results demonstrate that the addition of Alco-4773 to Polishing Compositions 6A-6D served to reduce defect count when compared to the control, which did not include Alco-4773. In particular, Polishing Compositions 6A and 6C exhibited greater silicon oxide removal rates compared to the control while maintaining lower polysilicon removal rates. Polishing Compositions 6A and 6C also demonstrated a significant reduction in defect counts compared to the control for defects measured at the 0.16 micron threshold.

Polishing Compositions 6B and 6D, which included 50 ppm Alco-4773, exhibited very low defect counts at both the 0.16 and 0.3 micron thresholds when compared to the control, providing further support that the presence of Alco-4773 reduced the defect count in the polishing compositions tested.

Example 7

This example demonstrates the effects of the hydrophobic surfactant Hydropalat 3323 and wet-process ceria abrasive particles of an average particle size of 30 nm or less on 1) silicon oxide removal rate from blanket wafers polished with Polishing Compositions 7A-7D; 2) polysilicon removal rate from polysilicon blanket wafers polished with Polishing Compositions 7A-7D: 3) the spin-on-glass (SOG) removal rate from SOG blanket wafers polished with Polishing Compositions 7A-7D: and 4) the DCN counts exhibited by Polishing Compositions 7A-7D on blanket wafers polished with Polishing Compositions 7A-7D. These effects were also compared to a control polishing composition.

The polishing compositions in this example comprised 6000 ppm PEG 8000, 120 ppm triethanolamine, the hydrophobic surfactant Hydropalat 3323 (750 or 1500 ppm), and 2.4% wet process ceria abrasive particles of an average particle size of 30 nm or less. All combinations were tested at 0.43% solids.

The control in Table 7B, below, comprised 1000 ppm Igepal CO890, 500 ppm polysorbate 20, and 120 ppm triethanolamine.

Blanket wafers of TEOS, SOG, HDP, and polysilicon were polished with the set of Polishing Compositions 7A-7D and the control. Polishing was performed on a Mirra™ CMP apparatus (Applied Materials, Inc., Santa Clara, Calif.).

Following polishing, the TEOS, HDP, SOG and polysilicon removal rates for Polishing Compositions 7A-7D and the control polishing composition were measured in Å/min. The results are listed in Table 7B.

Additionally, DCN counts of Polishing Compositions 7A-7D were compared to the control at a 0.16 micron threshold. Defect counts were generated using SEM to detect scratches on the wafer surfaces after polishing. The results are also listed in Table 7B.

TABLE 7A

Polishing Composition Summary

| Polishing Composition | Hydropalat 3323 (ppm) | Cationic Surfactant (ppm) |
|---|---|---|
| 7A | 750 | 25 |
| 7B | 1500 | 25 |
| 7C | 750 | 75 |
| 7C | 1500 | 75 |

TABLE 7B

Removal Rate and Defect Performance for Polishing Compositions 7A-7D

| Polishing Composition | TEOS RR (Å/min) | HDP RR (Å/min) | SOG RR (Å/min) | Poly Si RR (Å/min) | DCN Counts (0.16 μm Threshold) |
|---|---|---|---|---|---|
| 7A | 879 | 334 | 2789 | 33 | 1340 |
| 7B | 229 | 212 | 1829 | 23 | 914 |
| 7C | 147 | 152 | 161 | 1 | 1683 |
| 7D | 70 | 33 | 110 | 3 | 1010 |
| Control | 2778 | 1334 | 4215 | 303 | 15493 |

These results demonstrate that the addition of Hydropalat 3323 to Polishing Compositions 7A-7D served to reduce defect count when compared to the control, which did not include Hydropalat 3323. In particular, Polishing Composition 7A maintained high silicon oxide removal rate, low polysilicon removal rate, and high SOG removal rate while exhibiting significantly reduced defect count when compared to the control.

Polishing Composition 7C, which possessed the highest defect count among Polishing Compositions 7A-7D, still exhibited a defect count approximately ten times less than the control, providing further support that Hydropalat 3233 served to reduce defect count All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "comprising" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
    (a) wet-process ceria abrasive particles having an average particle size of about 30 nm or less, wherein the ceria abrasive particles are substantially free of agglomeration in the polishing composition;
    (b) at least one alcohol amine in an amount from about 0.001 wt. % to about 1 wt. % of the composition;
    (c) at least one nonionic surfactant; and
    (d) water;
    wherein the composition has a pH of about 6 or more.

2. The polishing composition of claim 1, wherein the abrasive particles have an average primary particle size of about 12 nm or less.

3. The polishing composition of claim 1, wherein the abrasive particles are present in an amount from about 0.001 wt. % to about 2 wt. % of the composition.

4. The polishing composition of claim 1, wherein the alcohol amine has a pKi of from about 6 to about 10.

5. The polishing composition of claim 1, wherein the alcohol amine bears a functional group having a pKa of from about 7 to about 11.

6. The polishing composition of claim 1, wherein the alcohol amine comprises 2-dimethylamino-2-methylpropanol, triethanolamine, diethanolamine, ethanolamine, 2-amino-2-methyl-1,3-propanediol, Bis-Tris, Tris or any combination thereof.

7. The polishing composition of claim 1, wherein the nonionic surfactant has an hydrophobic lipophilic balance of from about 7 to about 18.

8. The polishing composition of claim 1, wherein the nonionic surfactant comprises a polysorbate, sorbitan, polyoxyethylene ether, ethoxylate, acrylic, polyether polyol, or any combination thereof.

9. The polishing composition of claim 1, wherein the nonionic surfactant comprises a polysorbate 20, polysorbate 60, polysorbate 65, polysorbate 80, sorbitan monolaurate, polyoxyethylene (40) nonylphenyl ether, pentaerythritol ethoxylate, glycerol propoxylate-block-ethoxylate, acrylic copolymer, polypropylene oxide-based triol, or any combination thereof.

10. The polishing composition of claim 1, wherein the nonionic surfactant is present in an amount from about 0.001 wt. % to about 1 wt. % of the composition.

11. The polishing composition of claim 1, further comprising a thickener.

12. The polishing composition of claim 11, wherein the thickener comprises a cellulosic compound, dextran, polyvinyl alcohol, carrageenan, chitosan, or any combination thereof.

13. The polishing composition of claim 11, wherein the thickener comprises hydroxyethylcellulose, carboxyethylcellulose, hydroxymethylcellulose, methylcellulose, hydroxypropylcellulose, or any combination thereof.

14. The polishing composition of claim 11, wherein the thickener is present in an amount from about 0.001 wt. % to about 1 wt. % of the composition.

15. The polishing composition of claim 1, further comprising a cationic polymer.

16. The polishing composition claim 15, further comprising thickener.

17. The polishing composition of claim 15, wherein the cationic polymer comprises poly(methacryloxyethyltrimethylammonium) chloride (polyMADQUAT), poly(diallyldimethylammonium) chloride (polyDADMAC), poly(acrylamide), poly(allylamine), poly(vinylimmidazolium), poly(vinylpyridinium), or any combination thereof.

18. The polishing composition of claim 15, wherein the cationic polymer is present in an amount from about 0.001 wt. % to about 1 wt. % of the composition.

* * * * *